United States Patent [19]

Hanatani et al.

[11] Patent Number: 5,400,284
[45] Date of Patent: Mar. 21, 1995

[54] SEMICONDUCTOR INTEGRATED CIRCUIT

[75] Inventors: Shingo Hanatani; Kazumasa Ando, both of Kawasaki, Japan

[73] Assignee: Kabushiki Kaisha Toshiba, Kawasaki, Japan

[21] Appl. No.: 171,697

[22] Filed: Dec. 22, 1993

[30] Foreign Application Priority Data

Dec. 28, 1992 [JP] Japan .................................. 4-361244

[51] Int. Cl.[6] .............................................. G11C 7/00
[52] U.S. Cl. ..................................... 365/203; 365/204
[58] Field of Search ................ 365/203, 204; 395/400; 307/446, 480

[56] References Cited

U.S. PATENT DOCUMENTS

| | | | |
|---|---|---|---|
| 4,905,197 | 2/1990 | Urai | 365/204 |
| 5,200,924 | 4/1993 | Wong | 365/204 |
| 5,243,571 | 9/1993 | Brossard | 365/204 X |

FOREIGN PATENT DOCUMENTS 63-263943 10/1988 Japan .

*Primary Examiner*—Eugene R. LaRoche
*Assistant Examiner*—Son Dinh
*Attorney, Agent, or Firm*—Finnegan, Henderson, Farabow, Garrett & Dunner

[57] ABSTRACT

A precharge transistor precharges a bus. A discharge transistor discharges the bus. A push-pull driver is connected to the bus, and consists of a p-channel MOS transistor and an n-channel MOS transistor. The push-pull driver sets the potential of the bus to "H" level or "L" level. A detection circuit detects which one of the discharge transistor and the push-pull driver is being driven. When the push-pull drive is being driven, a control circuit renders the precharge transistor inoperative.

8 Claims, 3 Drawing Sheets

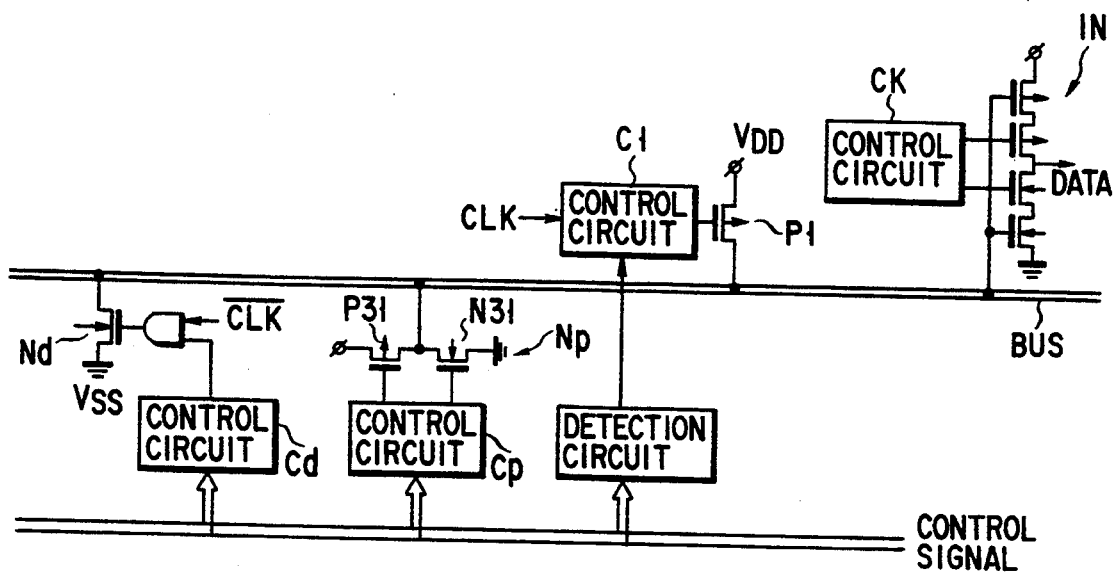
F I G. 3
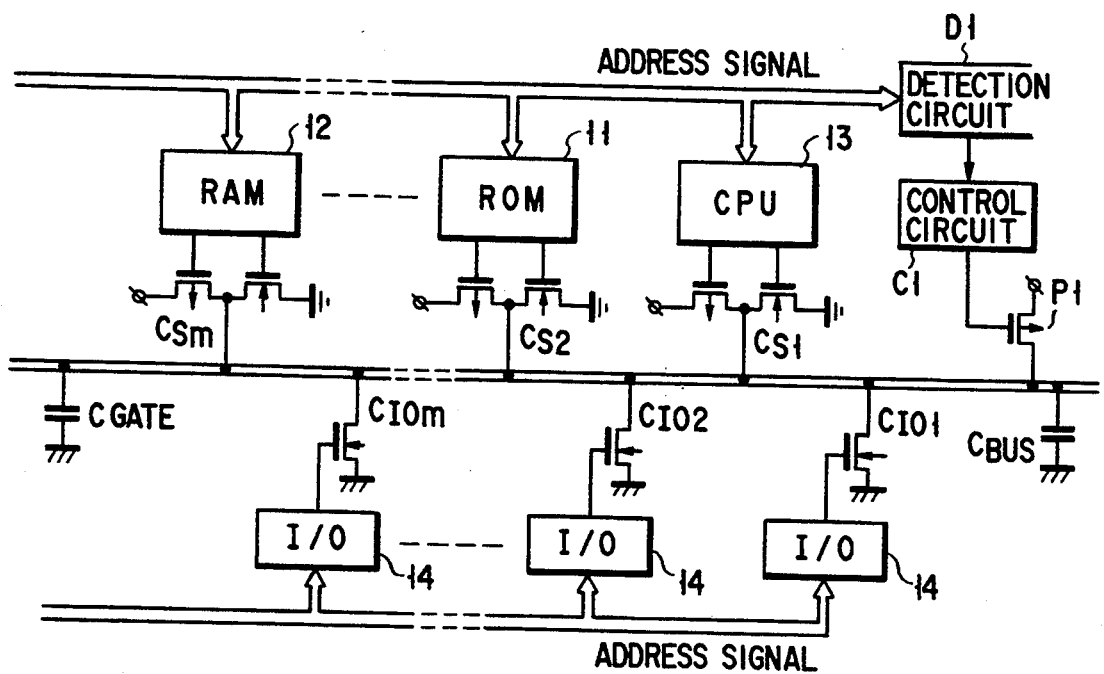
F I G. 4

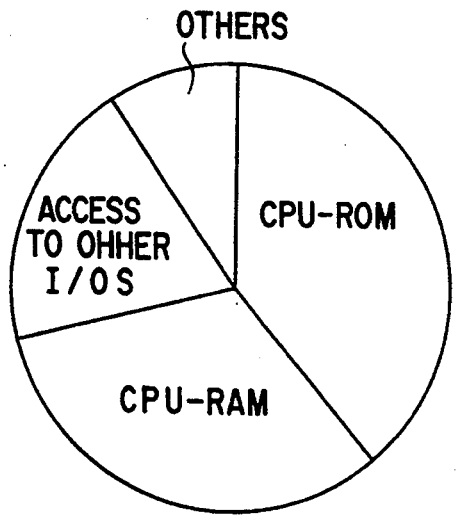
USE RATIO OF
DATA BUS
F I G. 5A
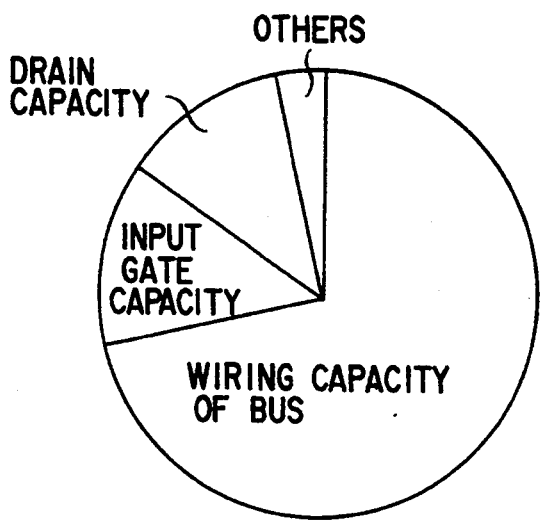
CAPACITY RATIOS
IN BUS LINE
F I G. 5B
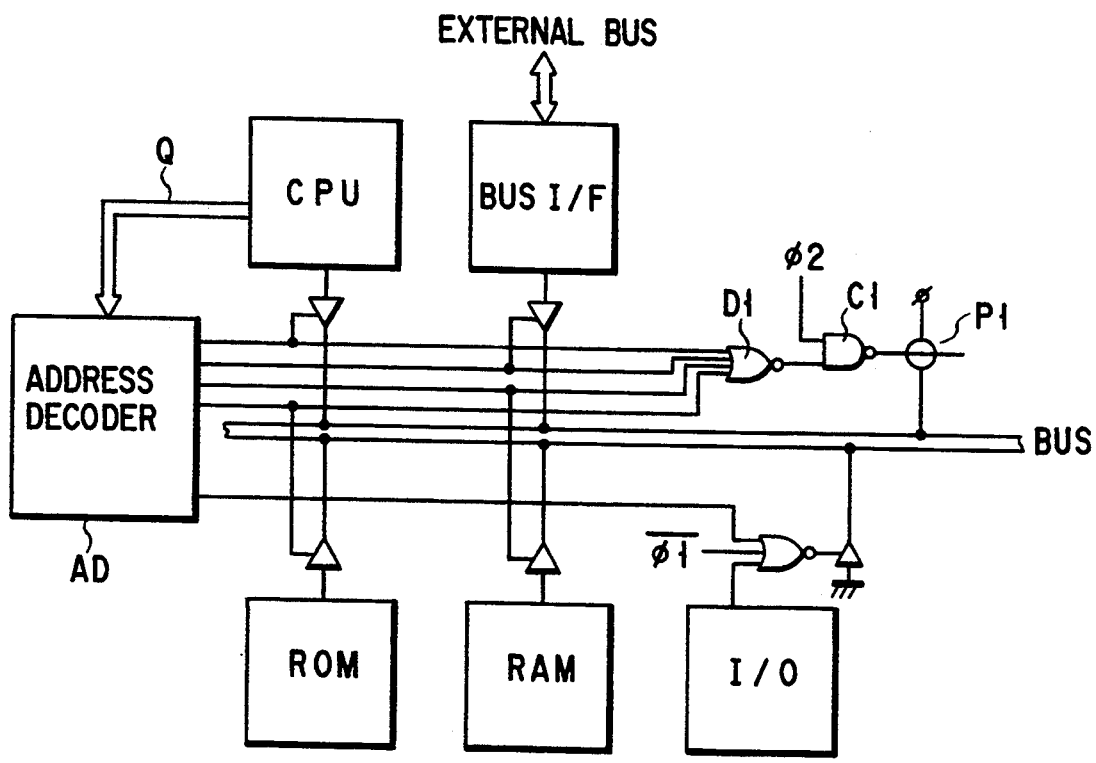
F I G. 6

SEMICONDUCTOR INTEGRATED CIRCUIT

BACKGROUND OF THE INVENTION

1. Field of the Invention

This invention relates to a bus-driving system employed in a semiconductor integrated circuit, and in particular to a device contributing to saving power required in a bus-driving circuit.

2. Description of the Related Art

There are two bus-driving systems—a dynamic system and a static system.

FIG. 1 shows a dynamic semiconductor integrated circuit.

A transistor P1 is turned on when a clock signal CLK becomes "H (high)" level, thereby precharging a bus BUS to "H" level. Further, when the clock signal CLK is at "H" level, transistors N51–N5n are in the off-state, and an input circuit IN is in the cut-off state.

The transistor P1 is turned off when the clock signal CLK becomes "L (low)" level. At this time, the bus BUS is in a floating state, with the "H" level maintained. Further, when the clock signal CLK is at "L" level, each of the transistors N51–N5n is in the on-or off-state in accordance with a signal supplied from corresponding one of control circuits C51–C5n.

When the clock signal CLK is at "L" level, and all the transistors N51–N5N are in the off-state, the bus BUS keeps at "H" level. When the clock signal CLK is at "L" level, and at least one of the transistors N51–N5N is in the on-state, the bus BUS is at "L" level.

In the above-described dynamic system, the bus BUS is precharged to "H" level a number of times corresponding to the number of cycles of the clock signal CLK. Thus, when, for example, 0-data is transferred from a ROM, a RAM or a CPU to the bus BUS, the wiring of the bus BUS and all the loads connected to the bus BUS are repeatedly charged and discharged, with the result that the circuit consumes a large amount of power.

The power consumption has been more and more increased in accordance with an increase in the number of buses or in the length of wiring. Moreover, the higher the frequency of the clock signal CLK, the larger the power consumption of a semiconductor integrated circuit.

When the clock signal CLK is at "L" level, the input circuit IN can operate. Accordingly, the data in the bus BUS is transferred to the ROM, the RAM or an I/O in accordance with an instruction from a control circuit Ck.

FIG. 2 shows a static semiconductor integrated circuit.

The bus BUS is kept at "H" level by means of p-channel MOSFETs P61–P6n, and at "L" level by means of n-channel MOSFETs N61–N6n. The p-channel MOSFETs P61–P6n and the n-channel MOSFETs N61–N6n are controlled by control circuits C61–C6n.

This static system requires p-channel MOSFETs, whose number is larger by one than the first-mentioned dynamic system. This makes the static system have a more complicated control circuit than the dynamic system, and increases the required area of the driving circuit for outputting data to the bus BUS.

SUMMARY OF THE INVENTION

The present invention has been developed to overcome the above-described drawbacks, and aims to reduce the power consumption and the required area of a driving circuit for a bus.

According to an aspect of the invention, there is provided a semiconductor integrated circuit comprising: a bus; precharge means for precharging the bus; discharge means responsive to a clock signal for discharging the bus while the precharge means does not precharge the bus; drive means, consisting of two transistors, for driving the transistors independently to set the potential of the bus to a high level or a low level; detection means for detecting which one of the discharge means and the drive means is being driven; and control means responsive to the clock signal and a signal output from the detection means, for rendering the precharge means inoperative when at least the drive means is being driven.

According to another aspect of the invention, there is provided a semiconductor integrated circuit comprising: a bus; a first circuit including a ROM, a RAM and a CPU which frequently output data items to the bus; a second circuit including an I/O which outputs data items to the bus less frequently than the first circuit; precharge means for precharging the bus; discharge means, connected between the first circuit and the bus, for discharging the bus while the precharge means does not precharge the bus; drive means, consisting of two transistors connected between the second circuit and the bus, for driving the transistors independently to set the potential of the bus to a high level or a low level; detection means for detecting which one of the discharge means and the drive means is being driven; and control means responsive to the clock signal and a signal output from the detection means, for rendering the precharge means inoperative when at least the drive means is being driven.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a circuit diagram, showing an integrated circuit according to the invention; FIG. 4 is a circuit diagram, showing a case where the integrated circuit of the invention is applied to a microprocessor;

FIGS. 5A and 5B are views, showing the use ratios of data bus and the capacitance ratios in a bus line, respectively; and FIG. 6 is a circuit diagram, showing an essential part of a control section employed in the invention.

DETAILED DESCRIPTION OF THE PREFERRED EMBODIMENTS

Figure 1:
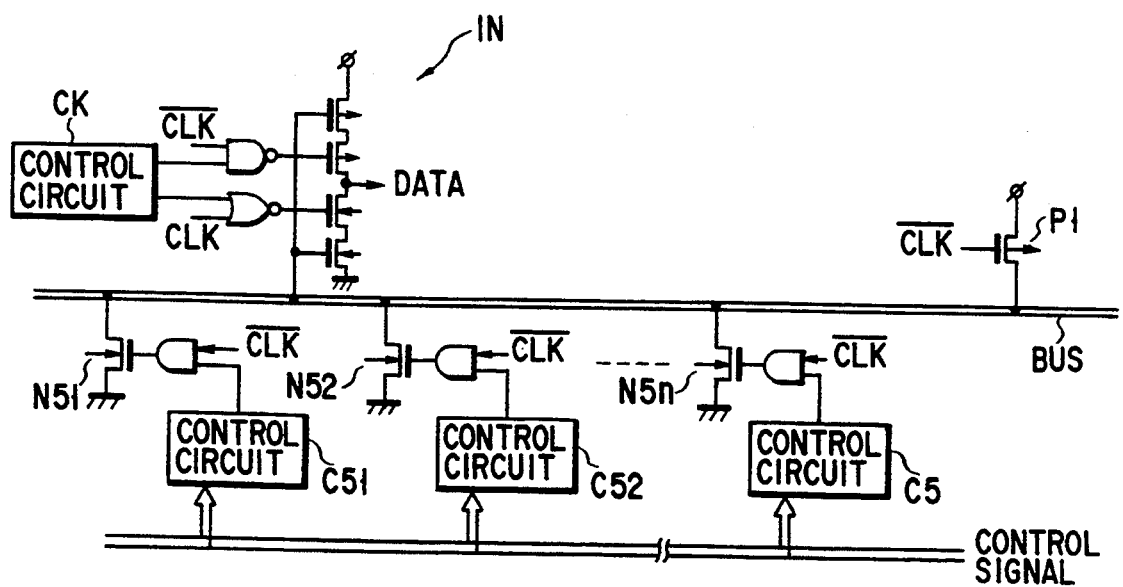
FIGS. 1 and 2 are circuit diagrams of conventional integrated circuits.
Figure 2:
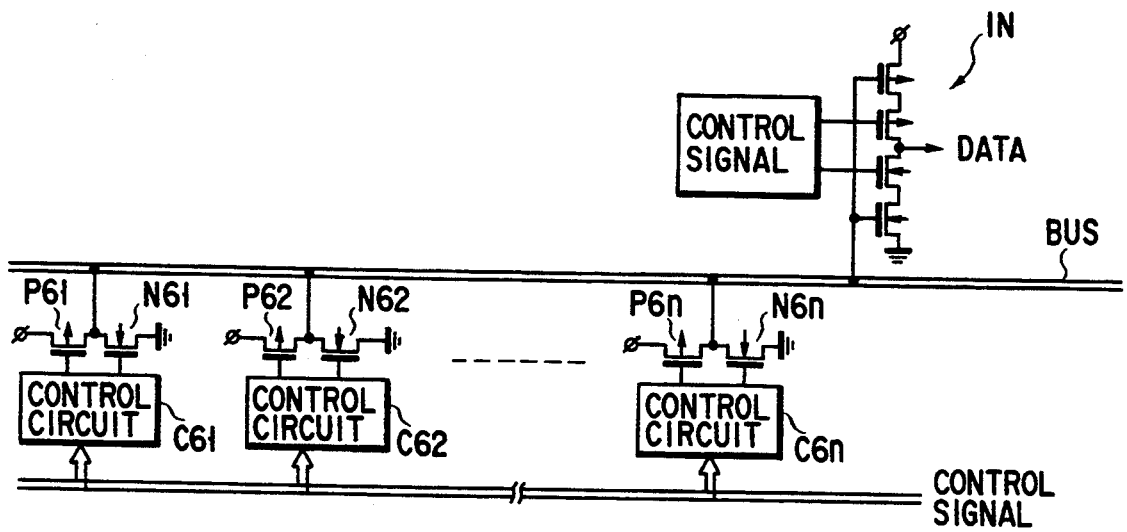

A semiconductor integrated circuit according to the invention will be explained in detail with reference to the accompanying drawings.

FIG. 3 shows a semiconductor integrated circuit according to the embodiment of the invention.

Reference sign P1 designates a precharge transistor connected between a power source VDD ("H" level) and a bus BUS. The operation of the transistor P1 is controlled by a control circuit C1. Reference sign Nd designates a discharge transistor connected between a power source VSS ("L" level) and the bus BUS. The operation of the transistor Nd is controlled by a control circuit Cd.

The precharge and discharge transistors P1 and Nd and the control circuit Cd constitute a dynamic bus-driving circuit.

Reference sign Np denotes a push-pull drive circuit, which comprises a p-channel MOSFET P31 and an n-channel MOSFET N31 and is controlled by a control circuit Cp.

The push-pull drive circuit Np constitutes a static bus-driving circuit.

The bus BUS is connected to an input circuit IN, which is controlled by a control circuit Ck and transfers data from the bus BUS to the ROM, the RAM or the I/O.

While the control circuits C1 and Cd operate the dynamic bus-driving circuits P1 and Nd, the control circuit Cp renders the static bus-driving circuit Np inoperative. On the other hand, while the control circuit Cp operates the static bus-driving circuit Np, the control circuits C1 and Cd render the dynamic bus-driving circuits P1 and Nd inoperative.

Reference sign D1 denotes a detection circuit for receiving a control signal. The detection circuit D1 detects which one of the dynamic bus-driving circuits P1 and Nd and the static bus-driving circuit Nd is operating. Reference sign C1 denotes a control circuit for the precharge transistor P1, which controls the on/off of the precharge transistor P1 on the basis of the detection result of the detection circuit D1.

It can easily be detected whether the dynamic system or the static system is operative, since the same control signal is input to the control circuits Cp and Cd and the detection circuit D1.

The detection result is supplied to the control circuit of the precharge transistor. When the static system is operative, i.e., when the push-pull drive circuit Np is driven, the control circuit C1 makes the precharge transistor P1 inoperative. On the other hand, when the dynamic system is operative, i.e., when the discharge transistor Nd is driven, the control circuit C1 performs on/off control of the precharge transistor P1.

FIG. 4 shows a case where the invention is applied to a microprocessor having a CPU, a circuit such as a memory for frequently outputting data, and an I/O such as a timer which does not often output data.

In this case, circuits for frequently outputting data to the bus, such as a ROM 11, a RAM 12 and a CPU 13, are static systems, while an I/0 14 is a dynamic system.

Then, the relationship between the total load capacity and the consumed current will be explained.

A. Total load capacity C1

Support that C Bus represents the capacity of the wiring of the bus, and C gate represents the total capacity of an input gate connected to the bus. Each of these capacities has a single value, irrespective of whether the circuit is a dynamic system or a static system, and therefore the capacities are represented by the C Bus and the C gate irrespective of the system type. Cs1–Csm each represent the drain capacity of a corresponding push-pull driver, and CI01–CI0n each the drain capacity of a corresponding discharge transistor.

Thus, the total load capacity Ct of the bus is given by $$Ct = C\text{ Bus} + C\text{ gate} + \sum_{x=1}^{m} C\text{ sx} + \sum_{x=1}^{n} C\text{ I0x} \qquad (1)$$

From the equation (1), the total load capacity CD assumed by the circuit shown in FIG. 4 when it performs dynamic operation is given by $$CD = C\text{ Bus} + C\text{ gate} + \sum_{x=1}^{n} C\text{ I0x} \qquad (2)$$

where $\sum_{x=1}^{n} C\text{ sx} = 0$.

Further, from the equation (1), the total load capacity CD assumed by the circuit shown in FIG. 4 when it performs dynamic operation is given by $$CD = C\text{ Bus} + C\text{ gate} + \sum_{x=1}^{n} C\text{ sx} \qquad (3)$$

where $\sum_{x=1}^{n} C\text{ I0x} = 0$.

Here, suppose that the ratio of the static operation of the device of the invention to the dynamic operation is represented by $\alpha$ [%], the operation frequency by f [Hz], and the power source voltage by V [V]. Further, supposing that the probability that data in the bus is 0 in a certain occasion is ½, and the probability of data in the bus being 0 is ½, the consumed current Ii of the device of the invention is given by $$Ii = f \times V \times \left( C\text{ Bus} + C\text{ gate} + \sum_{x=1}^{n} Csx + \right. \qquad (4)$$

$$\left. \sum_{x=1}^{n} CI0x \right) \times \{(1 - \alpha) + \alpha \times 1/2\}$$

The total load capacity Cp of the conventional dynamic semiconductor integrated circuit shown in FIG.

$$Cp = C\text{ Bus} + C\text{ gate} + \sum_{x=1}^{n+m} C\text{ I0x} \qquad (5)$$

Accordingly, the consumed current Ip of the device shown in FIG. 1 is given by $$Ip = f \times V \times \left( Cp = C\text{ Bus} + C\text{ gate} + \sum_{x=1}^{n+m} CI0x \right) \qquad (6)$$

The difference $\Delta = Ip - Ii$ between the consumed current Ii of the device of the invention and that Ip of the conventional device is expressed from the equations (4) and (6) as follows:

$$\Delta I = f \times V \times \left\{ \sum_{x=1}^{m} (CI0x - Csx) + (\alpha/2) \times \left( C\,Bus + C\,gate + \sum_{x=1}^{m} Csx + \sum_{x=1}^{n} CI0x \right) \right\} \quad (7)$$

The greater the value of $\Delta I$, the lower the consumed power of a microprocessor as a result of a reduction in consumed current.

It is evident from the equation (7) that the following conditions contribute to a reduction in the consumed current of the microprocessor:

a) Since $C\,sx > C\,I0x$ in general, m in the part of the push-pull system is low and $\alpha$ is high; and b) The ratio of (C Bus + C gate) to the total load capacity is high.

As is shown in FIG. 5A, the greater part of data transmission through the bus is performed between the CPU and the ROM and between the CPU and the RAM. On the other hand, I/Os (a timer, etc.), whose number is much larger than that of memories, are used much less frequently than the memories.

Moreover, as is shown in FIG. 5B, the greater part of the total load capacity of the device is occupied by the wiring capacity C Bus of the bus and the input gate capacity C gate. This means that the capacity of the static system, i.e., the drain capacity of the push-pull driver little influences the device.

Therefore, if integrated circuits such as the ROM, the RAM and the CPU, whose number is small but which are used frequently, are static systems, the above-described conditions (a) (i.e., the value m is reduced and the value $\alpha$ is increased) and (b) (i.e., the ratio of (C Bus + C gate) is high) can simultaneously be satisfied. Accordingly, the power required to operate the microprocessor can be reduced.

The above embodiment employs the control circuit C1 for controlling the precharge transistor P1 so as to enable both the above-described static and dynamic operations to be performed.

As is shown in FIG. 6, when the CPU performs data transmission, it usually outputs a signal Q for indicating which one of the I/Os is accessed by the CPU. After decoding the signal Q by means of an address decoder AD, and detecting by means of the detection circuit D1 whether or not the selected one of the I/Os is accessed, the control circuit C1 can perform on/off control of the precharge transistor P1 on the basis of the detected result.

In FIG. 6, reference sign $/\phi1$ denotes an output timing signal, and reference sign $\phi2$ a precharge timing signal. These timing signals are identical to each other.

In the structure shown in FIG. 6, although the overall pattern area is increased by the area required for the address decoder AD, it suffices if one chip has one address decoder, and the area required for one address decoder is so small as can be ignored. Accordingly, addition of the address decoder AD is not considered to be a great demerit in the semiconductor integrated circuit of the invention.

The semiconductor integrated circuit of the invention has the following advantages:

Since it incorporates driving circuits which serve as dynamic and static systems, the current consumed in the peripheral portion of a bus can be reduced.

Specifically i) Unnecessary charge and discharge of the bus can be prevented to thereby reduce the consumed current.

ii) The required area of bus driving circuits can be reduced, as compared with bus driving circuits consisting only of static systems.

iii) The static system can be operated at higher speed than the dynamic system.

iv) Since both static and dynamic drivers are employed, the overall circuit can be designed easily.

v) The circuit of the invention can be manufactured in the same process as the conventional circuit.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor integrated circuit comprising:
   a bus;
   precharge means for precharging the bus;
   discharge means responsive to a clock signal for discharging the bus while the precharge means does not precharge the bus;
   drive means, consisting of two transistors, for driving the transistors independently to set the potential of the bus to a high level or a low level;
   detection means for detecting which one of the discharge means and the drive means is being driven; and
   control means responsive to the clock signal and a signal output from the detection means, for rendering the precharge means inoperative when at least the drive means is being driven.

2. The semiconductor integrated circuit according to claim 1, wherein the precharge means is a p-channel MOS transistor connected between a power source and the bus.

3. The semiconductor integrated circuit according to claim 1, wherein the discharge means is an n-channel MOS transistor connected between the earth and the bus.

4. The semiconductor integrated circuit according to claim 1, wherein the drive means consists of a p-channel MOS transistor having a source connected to a power source and a drain connected to the bus, and an n-channel MOS transistor having a source connected to the earth and a drain connected to the bus.

5. A semiconductor integrated circuit comprising:
   a bus;
   a first circuit including a ROM, a RAM and a CPU which frequently output data items to the bus;
   a second circuit including an I/O which outputs data items to the bus less frequently than the first circuit;
   precharge means for precharging the bus;
   discharge means, connected between the second circuit and the bus, for discharging the bus while the precharge means does not precharge the bus;
   drive means, consisting of two transistors connected between the first circuit and the bus, for driving the transistors independently to set the potential of the bus to a high level or a low level;

detection means for detecting which one of the discharge means and the drive means is being driven; and control means responsive to the clock signal and a signal output from the detection means, for rendering the precharge means inoperative when at least the drive means is being driven.

6. The semiconductor integrated circuit according to claim 5, wherein the precharge means is a p-channel MOS transistor connected between a power source and the bus.

7. The semiconductor integrated circuit according to claim 5, wherein the discharge means is an n-channel MOS transistor connected between the earth and the bus.

8. The semiconductor integrated circuit according to claim 5, wherein the drive means consists of a p-channel MOS transistor having a source connected to a power source and a drain connected to the bus, and an n-channel MOS transistor having a source connected to the earth and a drain connected to the bus.

* * * * *